(12) United States Patent
Hertle (10) Patent No.: US 6,888,482 B1
(45) Date of Patent: May 3, 2005

(54) FOLDING ANALOG TO DIGITAL CONVERTER CAPABLE OF CALIBRATION AND METHOD THEREOF

(75) Inventor: Fritz Juergen Hertle, Zollikon (CH)

(73) Assignee: Realtek Semiconductor Corp., Hsin-Chu Hsien (TW)

( * ) Notice: Subject to any disclaimer, the term of this patent is extended or adjusted under 35 U.S.C. 154(b) by 0 days.

(21) Appl. No.: 10/707,861

(22) Filed: Jan. 19, 2004

(51) Int. Cl.[7] .......................... H03M 1/10; H03M 1/36
(52) U.S. Cl. .................................. 341/120; 341/159
(58) Field of Search ............................. 341/155, 158, 341/159, 118, 120, 160, 161; 330/9

(56) References Cited

U.S. PATENT DOCUMENTS 6,664,910 B1 * 12/2003 Mulder et al. .............. 341/158
6,674,389 B2 * 1/2004 Bult ............................ 341/159
6,822,600 B1 * 11/2004 Taft et al. ................... 341/155
6,825,716 B2 * 11/2004 McGowan ..................... 330/9

* cited by examiner

Primary Examiner—Patrick Wamsley
(74) Attorney, Agent, or Firm—Winston Hsu (57) ABSTRACT

An ADC is disclosed comprising at least one folder receiving an input voltage, generating a first output voltage and a second output voltage, and including a plurality of amplifiers and calibration logic for generating bias control signals according to the first output voltage and the second output voltage. Each of the amplifier receives one of a plurality of reference voltages and comprises a bias circuit for providing a bias current to the amplifier based on at least one of a plurality of bias control signals. During calibration, the calibration logic provides the bias control signals to control the bias circuit of each amplifier in the folder such that the first output voltage is substantially the same as the second output voltage.

12 Claims, 6 Drawing Sheets

FOLDING ANALOG TO DIGITAL CONVERTER CAPABLE OF CALIBRATION AND METHOD THEREOF

BACKGROUND OF INVENTION

1. Field of the Invention

The invention relates to an analog to digital converter, and more particularly, to a folding analog to digital converter capable of calibration and method thereof.

2. Description of the Prior Art

Analog to digital converters (ADCs) allow the use of sophisticated digital signal processing systems to process analog signals, which are common in the real world. High-speed ADCs are critical components of digital signal processing systems.

Flash type ADCs are commonly used for high speed signal applications. In a flash type ADC, a separate comparator is used for each possible output code bit, and this parallelism is what gives the flash ADC its speed. However, because the number of comparators grows exponentially with the resolution of the ADC, flash type ADCs have high power consumption and large integrated circuit (IC) chip area. These characteristics make flash type ADCs undesirable for low power portable applications.

Folding and interpolating ADCs have been widely used to overcome these power and IC area limitations of the flash type ADC. In a flash type ADC, at any time, only the comparators around the transition voltage provide useful information. Folding and interpolating ADCs exploit this fact to reduce the number of comparators, and thereby have a relatively low power consumption and smaller IC area when compared with flash based ADCs. In a folding and interpolating ADC, each comparator is connected to a group of amplifiers, also referred to as a folder.

Figure 1:
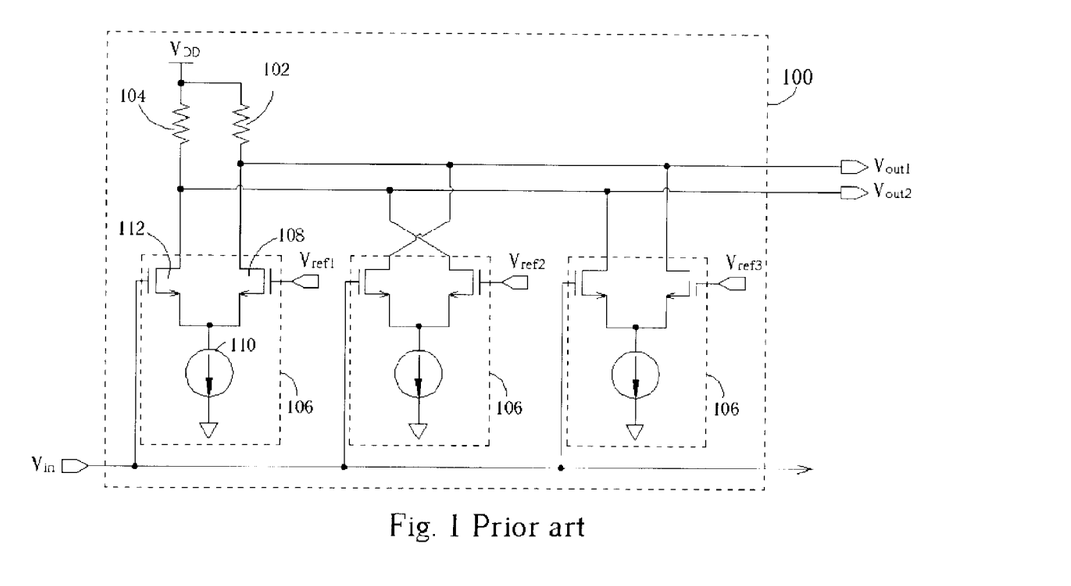
FIG. 1 is a schematic diagram of a conventional folding ADC.

FIG. 1 shows a conventional folding ADC 100. The folding ADC 100 receives an analog input voltage Vin, and generates a corresponding differential output voltage comprising a first output voltage Vout1 and a second output voltage Vout2. A first and a second pull-up resistor 102 and 104 connect the first output voltage Vout1 and the second output voltage Vout2 to a power supply node VDD, respectively. Additionally, the folding ADC 100 includes three differential amplifiers 106. Each amplifier 106 receives the input voltage Vin and one of a plurality of different reference voltages, Vref1, Vref2, and Vref3, and includes two transistors and a current source. In the folding ADC 100, the amplifiers receiving the odd numbered reference voltages (ex: Vref1 and Vref3 in FIG. 1) are connected in the same way as the first amplifier, which receives the reference voltage of Vref1. The amplifier receiving the even numbered reference voltage (ex: Vref2 in FIG. 1), has the connections for outputting the first output voltage Vout1 and the second output voltage Vout2 reversed, as shown in FIG. 1.

Figure 2:
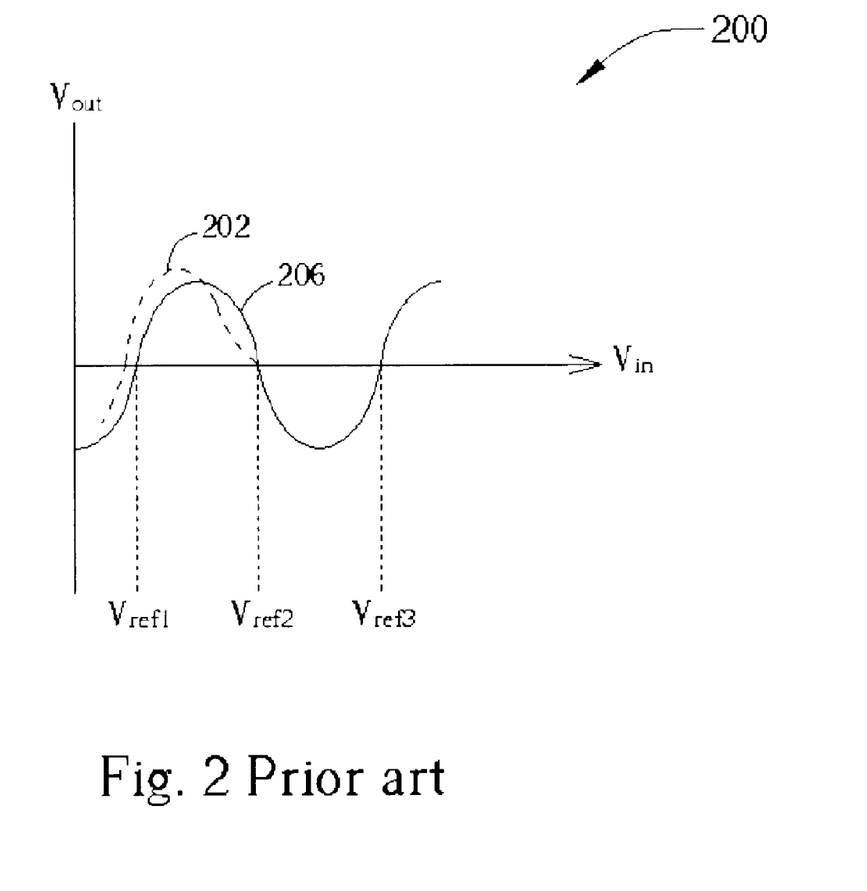
FIG. 2 is the differential output voltage of the folding ADC in FIG. 1.

FIG. 2 shows the differential output voltage Vout of the folding ADC 100. The output voltage Vout of the folding ADC 100 is a differential signal comprising the first output voltage Vout1 and the second output voltage Vout2 in FIG. 1. In FIG. 2, the ideal output voltage 206 has a zero crossing at each reference voltage (Vref1, Vref2, and Vref3). Because the amplifiers 106 have alternating connections to the first output voltage Vout1 and the second output voltage Vout2, the ideal differential output voltage 206 swings from positive to negative and vice versa as the input voltage crosses over each reference voltage. In the ideal situation, the first pull-up resistor 102 would be of the same value as the second pull-up resistor 104, and all the amplifiers 106 in the folding ADC 100 would be perfectly matched with each other. More specifically, both transistors 108, 112 in each amplifier would have equal characteristics such as threshold voltage, and each current source 110 would draw the same bias current through the amplifier 106. Of course, in the practice, due to process variations, for example, there are always slight variations between devices. The pull-up resistors 102,104 will not be of exactly the same value, the transistors 108,112 will not be perfectly matched, and there will be slight differences between the amounts of current drawn by each current source 110. Thus, as represented by the dotted line 202 in FIG. 2, the curve of FIG. 2 may deviate from the ideal output voltage 206.

These imperfect characteristics of the amplifiers and pull-up resistors may reduce the linearity of the ADC. This is a serious problem and several correction methods have been proposed. One common method of dealing with the non-linearity is to implement a digital correction function to correct the output of the ADC. During calibration, a function generator can be used to provide a set of known input voltages. For each input voltage, the output of the ADC is recorded. A mapping function converting the output of this particular ADC to the correct digital output value can then be formulated. This correction method, however, has several disadvantages including requiring a function generator to provide the input signal during calibration, as well as additional hardware or software cycles to map the output of the ADC to the correct digital value.

SUMMARY OF INVENTION

One objective of the claimed invention is to therefore provide an analog to digital converter (ADC) capable of calibrating, to solve the above-mentioned problems.

According to the claimed invention, an ADC is disclosed comprising at least one folder receiving an input voltage, generating a first output voltage and a second output voltage, and including a plurality of amplifiers and calibration logic for generating bias control signals according to the first output voltage and the second output voltage. Each of the amplifier receives one of a plurality of reference voltages and comprises a bias circuit for providing a bias current to the amplifier based on at least one of a plurality of bias control signals. During calibration, the calibration logic provides the bias control signals to control the bias circuit of each amplifier in the folder such that the first output voltage is substantially the same as the second output voltage.

Also according to the present invention, a method of calibrating an analog to digital converter (ADC) is disclosed. The ADC has at least one folder receiving an input voltage, generating a first output voltage and a second output voltage, and including a plurality of amplifiers, each amplifier is for receiving one of a plurality of reference voltages. For each amplifier in each folder, the method comprises the following steps: enabling first bias currents and second bias currents for the folder; setting the input voltage to be substantially the same potential as the reference voltage corresponding to the amplifier; and adjusting at least one of the first bias current and the second bias current of the amplifier such that the first output voltage is substantially the same as the second output voltage.

These and other objectives of the claimed invention will no doubt become obvious to those of ordinary skill in the art after reading the following detailed description of the preferred embodiment that is illustrated in the various figures and drawings.

DETAILED DESCRIPTION

Figure 3:
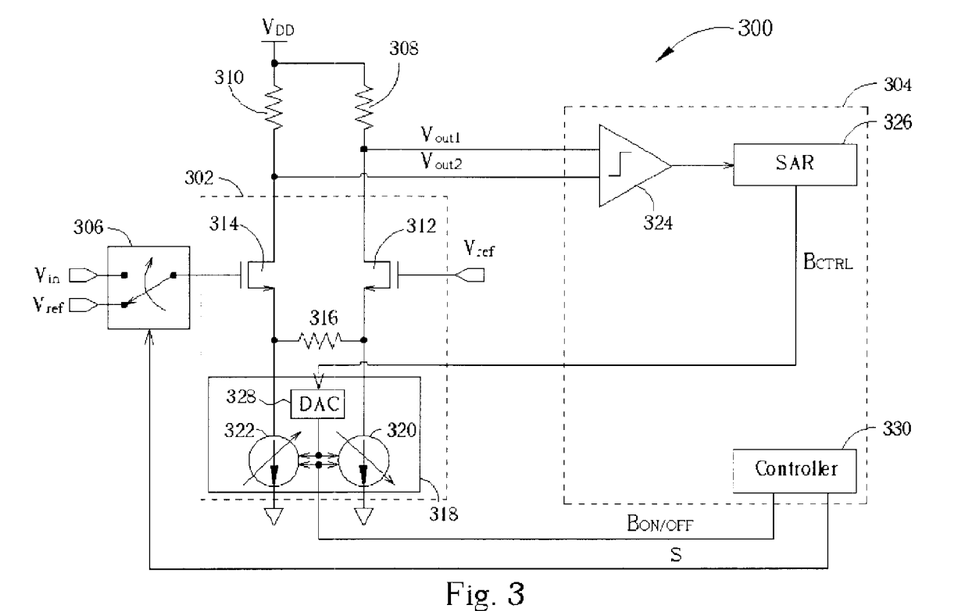
FIG. 3 is a schematic diagram of an amplifier and calibration logic according to an embodiment of the present invention.

FIG. 3 shows a schematic diagram 300 of an amplifier 302 and calibration logic 304 according to an embodiment of the present invention. The amplifier 302 has a first input terminal for receiving a reference voltage Vref. A second input terminal of the amplifier 302 is connected to a switch 306, which is for selectively receiving either an input voltage Vin or the same reference voltage Vref. The amplifier 302 has a first output voltage Vout1 and a second output voltage Vout2, and the output voltages are pulled up to a power supply node VDD by a first pull-up resistor 308 and a second pull-up resistor 310, respectively. The amplifier 302 comprises a first transistor 312, a second transistor 314, an impedance 316, and a bias circuit 318.

The drains of the first transistor 312 and the second transistor 314 are for outputting the first and the second output voltage Vout1, Vout2, respectively. The gate of the first transistor 312 is for receiving the reference voltage Vref, and the gate of the second transistor 314 is for receiving either the input voltage Vin or the reference voltage Vref as determined by the switch 306. The sources of the first transistor 312 and the second transistor 314 are connected together using the impedance 316 (implemented as a resistor in FIG. 3), and are also respectively connected to the bias circuit 318. The first output voltage Vout1 and the second output voltage Vout2 are connected to the calibration logic 304. The calibration logic 304 controls the bias circuit 318 using the bias on/off control signal $B_{ON/OFF}$ and the bias current control signal $B_{CTRL}$. Additionally the calibration logic 304 controls the switch 306 using the switch control signal S. The bias circuit 318 includes a digital to analog converter (DAC) 328, a first adjustable current source 320, and a second adjustable current source 322. The calibration logic 304 includes a low offset comparator 324, a successive approximation (SAR) unit 326, and a controller 330.

To calibrate the amplifier 302, the controller 330 switches the switch 306 to pass the reference voltage Vref to the second input terminal of the amplifier 302. In this condition, both input terminals of the amplifier 302 receive the reference voltage Vref, and the first output voltage Vout1 and the second output voltage Vout2 should therefore be equal in value, which results in a zero crossing in the differential output voltage Vout in FIG. 2. However, due to the imperfect characteristics of the devices, the first output voltage Vout1 may not be equal to the second output voltage Vout2. In this situation, the controller 330 controls the bias circuit 318 to draw a first bias current through the first transistor 312 and a second bias current through the second transistor 314 such that the first output voltage Vout1 is substantially the same as the second output voltage Vout2. It should be noted that in order to prevent any amplitude differences in the differential output voltage Vout shown in FIG. 2, the second bias current must be decreased by the same amount as the first bias current is increased and vice versa, to maintain a constant bias current through the amplifier 302. If the bias current adjustment is carefully controlled, the first output voltage and the second output voltage can be adjusted until they are substantially equal in value, thereby removing the shift 204 in the zero crossings of the differential output voltage Vout shown in FIG. 2.

The preferred bias current adjustment process is an iterative approach using successive approximation and is further described as follows. The controller 330 sets the switch 306 to provide the reference voltage Vref to the amplifier 302, and turns on the bias currents for the amplifier 302. The value of the first bias current and the second bias current are set to equal values of one-half the total bias current required for the amplifier 302, referred to as Bmiddle. The first output voltage Vout1 and the second output voltage Vout2 are compared by the low offset comparator 324, and the output of the low offset comparator 324 is connected to the SAR unit 326. If the first output voltage Vout1 is higher than the second output voltage Vout2, the SAR unit 326 increases the first bias current by $Bmiddle/(2^{i+1})$, where the variable i represents an iteration counter. For the first iteration, i1, for the second iteration, i=2 and so on. To ensure a constant bias current through the amplifier 302, the second bias current is decreased by the same amount of $Bmiddle/(2^{i+1})$. Internal to the bias circuit 318, the DAC 328 converts the bias current control signal $B_{CTRL}$ to analog signals, and the first current source 320 and the second current source 322 are thereby adjusted to draw the first bias current and the second bias current respectively. The first output voltage Vout1 and the second output voltage Vout2 are then compared by the low offset comparator 324, and the next iteration is performed. Depending on how accurately the zero crossings of the differential output voltage shown in FIG. 2 must be set, different numbers of iterations of bias current adjustments can be performed.

Figure 4:
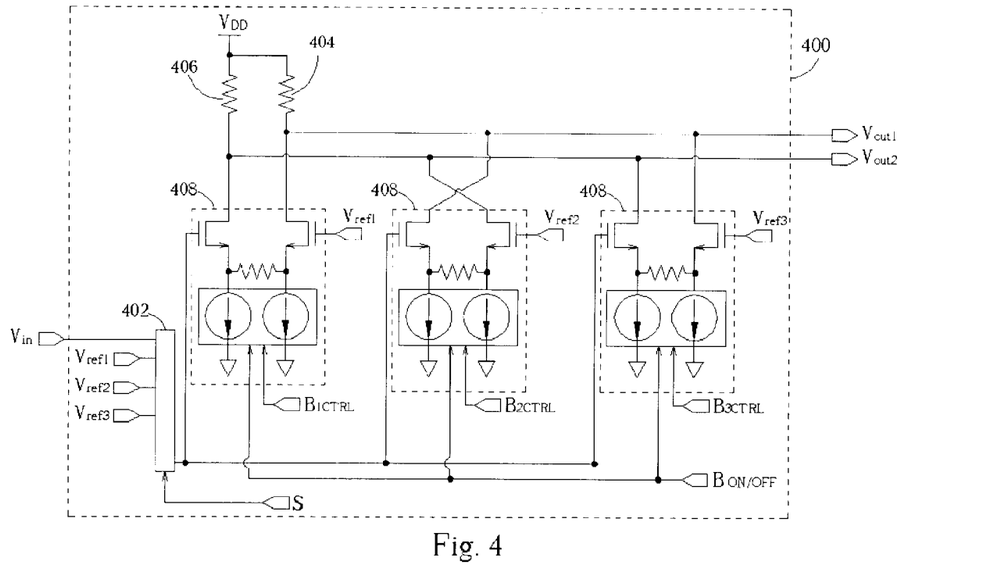
FIG. 4 is a folding ADC implemented using amplifiers as shown in FIG. 3.

FIG. 4 shows a folder 400 implemented using amplifiers as described in FIG. 3 according to an embodiment of the present invention. The folder 400 includes a multiplexer 402 allowing the folder to receive either the analog input voltage Vin or one of a plurality of reference voltages (Vref1 to Vref3). The folder 400 generates a corresponding differential output voltage comprising a first output voltage Vout1 and second output voltage Vout2, which are coupled to a power supply node VDD by a first and a second pull-up resistor 404 and 406, respectively. The folder 400 additionally includes three differential amplifiers 408. Each differential amplifier 408 is implemented as the amplifier 302 shown in FIG. 3, and receives the output signal of the multiplexer 402, one of the different reference voltages (Vref1 to Vref3), the bias current control signal $B1_{CTRL}$ to $B3_{CTRL}$, and the bias on/off control signal $B_{ON/OFF}$ for the folder 400.

During calibration, only the bias currents for the amplifiers 408 in the folder 400 being calibrated are turned on. The other folders are shut-off using their bias on/off control signals. The amplifiers 408 in the folder 400 being calibrated are calibrated one by one, each amplifier having its first and second bias currents iteratively adjusted using the process described in FIG. 3. Using the successive approximation approach described in FIG. 3, the first bias current and the second bias current are adjusted such that the first output voltage Vout1 and the second output voltage Vout2 are approximately the same. When finished, the first and second bias current values remain at these values, and the next amplifier is calibrated.

Figure 5:
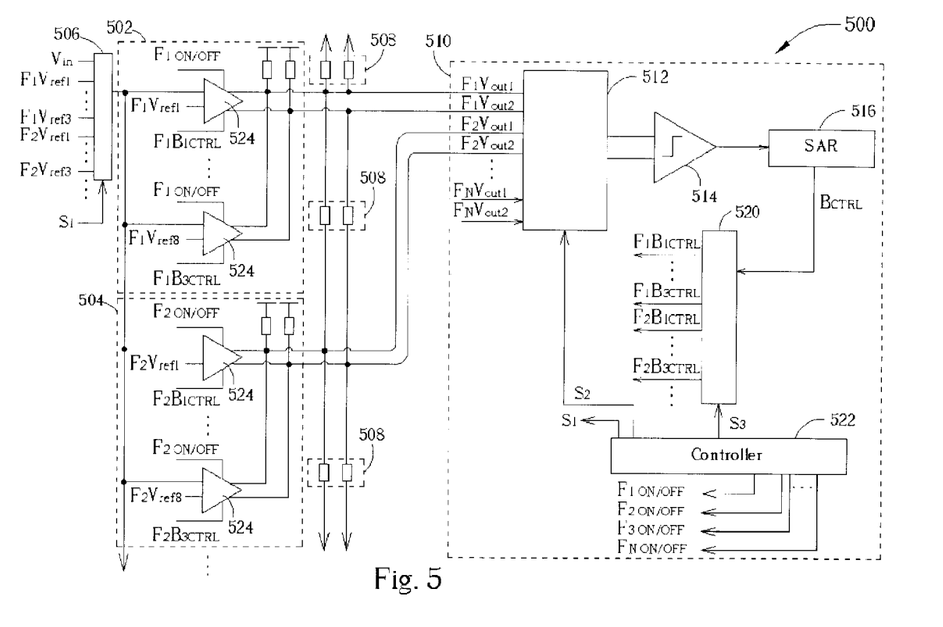
FIG. 5 shows a block diagram of an ADC including multiple folders that are implemented as shown in FIG. 4.

FIG. 5 shows a block diagram an ADC 500 including multiple folders implemented as shown in FIG. 4. The ADC 500 includes N folders including a first folder 502 and a second folder 504. For simplicity, the remaining folders are not shown but the calibration process for the remaining folders is the same as for the first two. Each folder contains three amplifiers 524 implemented as shown in FIG. 3. A multiplexer 506 allows the folders to receive either the analog input voltage Vin or one of a plurality of reference voltages. As each folder comprises three amplifiers 524, there are three different reference voltages per folder. As well as the analog input voltage Vin, the multiplexer 506 includes the reference voltages for all amplifiers in the ADC 500. Averaging resistors 508 are typically used in a folding ADC to average the differential voltage outputs of each folder in the ADC. The differential output voltages of each of the folders of the ADC 500 are connected to calibration logic 510. The calibration logic 510 includes a second multiplexer 512, a low offset comparator 514, a SAR unit 516, a demultiplexer 520, and a controller 522.

Calibration of the ADC 500 is done folder by folder with each amplifier being calibrated individually in each folder. During calibration, the controller 522 uses the bias on/off control signals (F1$_{ON/OFF}$ through FN$_{ON/OFF}$) to shut off all the amplifiers in the ADC except for the amplifiers in the folder being calibrated. The first bias current and the second bias current of the amplifier being calibrated are set to a middle bias value Bmiddle, and the controller 522 switches the first multiplexer 506 to connect the reference voltage of the amplifier being calibrated into the folder. Additionally, the controller 522 switches the second multiplexer 512 to connect the first output voltage and the second output voltage of the folder of the containing the amplifier being calibrated to the low offset comparator 512. Using the successive approximation approach described in FIG. 3, the first output voltage F1$_{Vout1}$ and the second output voltage F1$_{Vout2}$ are compared by the low offset comparator 514, Bmiddle/($2i+1$), where the variable i represents the iteration counter. To ensure a constant total bias current through the amplifier being calibrated, the second bias current is decreased by the same amount of Bmiddle/($2^{i+1}$). The demultiplexer is used to send the bias current control signals (F$_1$B1$_{CTRL}$ to F$_N$B3$_{CTRL}$) to control the bias circuits of the amplifier being calibrated. The first output voltage and the second output voltage are again compared by the low offset comparator 514, and the next iteration is performed. Depending on how accurate the zero crossing of the differential output voltage shown in FIG. 2 must be, different numbers of iterations of bias current adjustments can be performed.

When the first output voltage and the second output voltage are substantially the same, calibration of the amplifier is complete and the controller 522 switches the first multiplexer 506 and the demultiplexer 520 to the next amplifier in the current folder. If all amplifiers in the current folder have been calibrated, the controller disables the bias currents for the current folder and enables the bias currents for the next folder using the bias on/off control signals (F1$_{ON/OFF}$ to FN$_{ON/OFF}$). The demuliplexter 520 continues to send the proper bias current control signals to the amplifier that has just finished being calibrated so that when the ADC 500 begins normal operations, the proper bias currents are used. When all the amplifiers 524 in each folder of the ADC 500 have been calibrated, the controller 522 switches the multiplexer 506 to provide the analog input voltage Vin to the folders, turns off the second multiplexer 512, turns on the bias currents of all the amplifiers 524 in all the folders in the ADC 500 using the bias on/off control signals (F1$_{ON/OFF}$ to FN$_{ON/OFF}$), and the ADC 500 begins normal operations.

As an example, when the first amplifier 524 in the first folder 502 (the amplifier connected to the reference voltage F1$_{Vref1}$) is being calibrated, the controller 522 sets the first multiplexer 506 to connect F1$_{Vref}$ as the input signal to the folders and sets the second multiplexer 512 to connect F1$_{Vout1}$ and F1$_{Vout2}$ to the low offset comparator 514. Using the successive approximation approach described in FIG. 3, the first bias current and the second bias current are adjusted using the bias current control signal F$_1$B1$_{CTRL}$ until the first output voltage F1$_{Vout1}$ and the second output voltage F1$_{Vout2}$.

Figure 6:
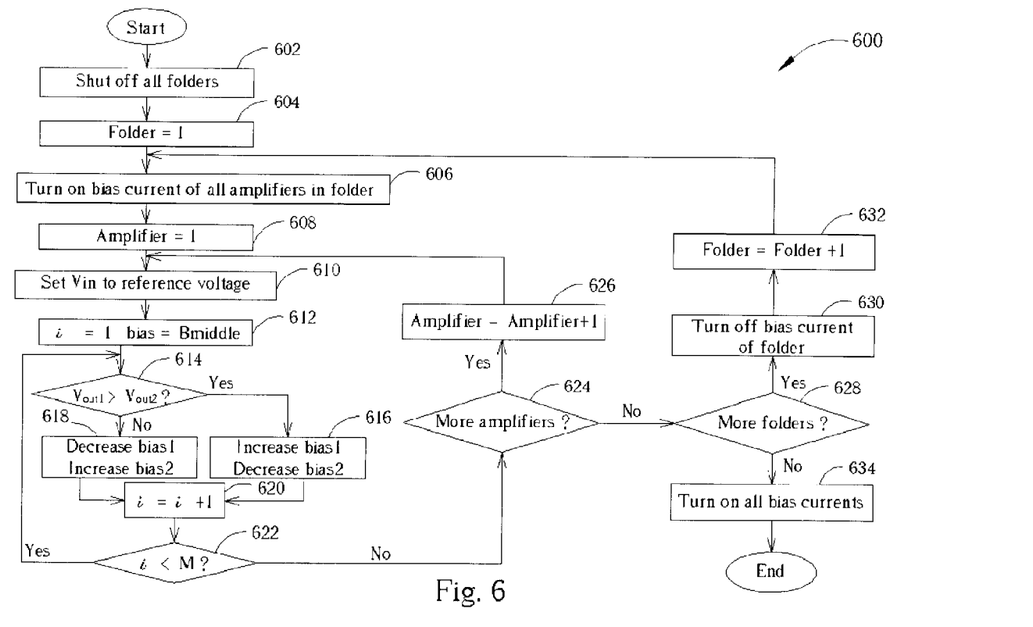
FIG. 6 is a flowchart of a method of calibrating the ADC of FIG. 5 according to an embodiment of the present invention.

FIG. 6 shows a flowchart 600 describing a method of calibrating an ADC according to the present invention and contains the following steps:

Step 602: Shut off the bias currents for all amplifiers in all folders in the ADC.

Step 604: Start calibration by setting the folder under calibration to the first folder.

Step 606: Turn on the first bias current and the second bias current for the amplifiers in the folder under calibration.

Step 608: Set the amplifier being calibrated to the first amplifier in the folder under calibration.

Step 610: Set the input voltage for the folder equal to the reference voltage of the amplifier being calibrated.

Step 612: Set an iteration counter to one (i=1), and set the first bias current and the second bias current of the amplifier being calibrated to a middle bias value (Bmiddle).

Step 614: Is the first output voltage greater than the second output voltage? If yes, proceed to step 616, otherwise proceed to step 618.

Step 616: Increase the first bias current by Bmiddle/($2i+1$.

Step 618: Decrease the first bias current by Bmiddle/($2^{i+1}$), where the variable i is the iteration counter. To ensure a constant bias current through the amplifier being calibrated, increase the second bias current by the same amount of Bmiddle/($2^{i+1}$).

Step 620: In order to do the next successive approximation iteration, increment the iteration counter (i=i+1).

Step 622: Is the iteration counter i less than a maximum iteration limit. M? If yes, proceed to step 614, otherwise, proceed to step 624.

Step 624: Are there more amplifiers in the folder under calibration that have not been calibrated yet? If yes, proceed to step 626, otherwise, proceed to step 628.

Step 626: Set the amplifier being calibrated to the next amplifier in the folder under calibration.

Step 628: Are there more folders in the ADC that have not been calibrated yet? If yes, proceed to step 630, otherwise, proceed to step 634.

Step 630: Turn off the first bias current and the second bias current for the amplifiers in the folder under calibration.

Step 632: Set the folder under calibration to the next folder in the ADC and proceed to step 606.

Step 634: Turn on all folders in the ADC and begin normal ADC operations.

It should be noted that although standard CMOS transistors have been shown throughout the detailed description of the present invention, BJT or BiCMOS implementations are also acceptable. As the power consumption of circuits employing standard CMOS is lower than BJT or BiCMOS based circuits, a standard CMOS based implementation is the preferred embodiment of the present invention. Likewise, single ended configurations can also be used and the actual number of amplifiers in each folder and the number of folders can be varied according to design requirements.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An analog to digital converter (ADC) comprising:
    at least one folder receiving an input voltage, generating a first output voltage and a second output voltage, and including:
    a plurality of amplifiers, wherein each of the amplifier receives one of a plurality of reference voltages and comprises:
    a bias circuit for providing a bias current to the amplifier based on at least one of a plurality of bias control signals; and
    calibration logic for generating the bias control signals according to the first output voltage and the second output voltage;
    wherein during calibration, the calibration logic provides the bias control signals to control the bias circuit of each amplifier in the folder such that the first output voltage is substantially the same as the second output voltage.

2. The ADC of claim 1, wherein each amplifier further comprises:
    a first transistor having a gate to receive one of a plurality of reference voltages, a drain to output the first output voltage, and a source;
    a second transistor having a gate to receive the input voltage, a drain to output the second output voltage, and a source; and
    an impedance coupled between the source of the first transistor and the second transistor; and
    wherein the bias circuit further comprises:
    a first bias circuit coupled to the source of the first transistor for drawing a first bias current of the first transistor; and
    a second bias circuit coupled to the source of the second transistor for drawing a second bias current of the second transistor.

3. The ADC of claim 2, further comprising:
    a first multiplexer for selectively setting the input voltage to substantially the same potential as one of the reference voltages according to a reference control signal;
    wherein the calibration logic further generates the reference control signal; and
    wherein during calibration, for each amplifier in each folder, the calibration logic sets the input voltage substantially the same as the reference voltage for the amplifier using the reference control signal.

4. The ADC of claim 2, wherein the impedance is a resistor.

5. The ADC of claim 2, wherein the sum of the first bias current and the second bias current is constant.

6. The ADC of claim 1, wherein during calibration, for each amplifier in each folder, the first bias current and the second bias current are adjusted by a predetermined amount using at least one of the bias control signals.

7. The ADC of claim 6, wherein during calibration, for each amplifier in each folder, the calibration logic iteratively adjusts the value of the first and the second bias current of the amplifier, wherein the adjustment is iterated i times and the predetermined amount is $Bmiddle/2^{i+1}$, wherein Bmiddle is half of the sum of the first and the second bias current.

8. A method of calibrating an analog to digital converter (ADC) having at least one folder receiving an input voltage, generating a first output voltage and a second output voltage, and including a plurality of amplifiers, each amplifier is for receiving one of a plurality of reference voltages; wherein, for each amplifier in each folder, the method comprises the following steps:
    setting the input voltage to be substantially the same as the reference voltage corresponding to the amplifier; and
    adjusting at least one of the bias currents of the amplifier based on the first and the second output voltage such that the first output voltage is substantially the same as the second output voltage.

9. The method of claim 8, wherein for each of the amplifiers in each folder, the bias currents further include first and second bias currents, wherein when adjusting the bias currents of the amplifier, the sum of the first and the second bias currents is constant.

10. The method of claim 9, wherein adjusting the first and the second bias currents further comprises the following steps:
    setting the first bias current and the second bias current to be half of the sum of the first and the second bias current;
    sampling the first output voltage and the second output voltage; and
    adjusting the first and the second bias currents based on the first and the second output voltages, wherein the first output voltage corresponds to the first bias current and the second output voltage corresponds to the second bias current.

11. The method of claim 10, wherein the first and the second bias currents are adjusted by a predetermined amount.

12. The method of claim 11, wherein the first and the second bias currents are iteratively adjusted by the predetermined amount for i times, and the predetermined amount is $Bmiddle/2^{i+1}$, wherein Bmiddle is half of the sum of the first and the second bias current.

* * * * *